United States Patent [19]

Svejkovsky

[11] Patent Number: 4,460,804
[45] Date of Patent: Jul. 17, 1984

[54] FLEXIBLE ELECTRICALLY CONDUCTIVE ADHESIVE TAPE

[76] Inventor: Roger L. Svejkovsky, 1109 20th St. NE., Austin, Minn. 55912

[21] Appl. No.: 404,527

[22] Filed: Aug. 2, 1982

[51] Int. Cl.³ .............................................. H01B 7/08
[52] U.S. Cl. ............................ 174/117 A; 174/117 F; 174/117 FF; 174/117 PC; 156/51; 156/53
[58] Field of Search ......... 174/117 F, 117 FF, 117 A, 174/117 PC; 156/51, 53

[56] References Cited

U.S. PATENT DOCUMENTS

| 2,345,229 | 3/1944 | Barmack | 156/53 X |
|---|---|---|---|
| 2,963,538 | 12/1960 | Dahlgren | 174/117 PC |
| 3,168,617 | 2/1965 | Richter | 174/117 FF |
| 3,239,916 | 3/1966 | Love | 174/117 A |
| 3,524,921 | 8/1970 | Wolf | 174/117 A |
| 4,251,712 | 2/1981 | Parr | 174/117 A X |

FOREIGN PATENT DOCUMENTS

| 2018774 | 11/1971 | Fed. Rep. of Germany | 174/117 FF |
|---|---|---|---|
| 1319821 | 12/1964 | France | 174/117 A |
| 1356387 | 12/1964 | France | 174/117 A |
| 529462 | 6/1955 | Italy | 174/117 A |
| 660136 | 1/1964 | Italy | 174/117 A |
| 198739 | 6/1923 | United Kingdom | 174/117 A |
| 963629 | 7/1964 | United Kingdom | 174/117 A |

Primary Examiner—J. V. Truhe
Assistant Examiner—Morris H. Nimmo
Attorney, Agent, or Firm—James V. Harmon

[57] ABSTRACT

A thin, flexible, electrically conductive adhesive tape is described suitable for do-it-yourself wiring in low voltage applications including a pair of longitudinally extending parallel electrical conductors each made of a multiplicity of strands of wire enclosed within a backing strip. The backing is paper-thin and can comprise a pair of layers of transparent or translucent plastic material bonded together around the conductors or a single thickness within which the conductors are embedded, the backing being formed for example by co-extrusion of upper and lower layers which are brought together while still in a molten condition so as to fuse together totally enclosing the wires. A stripable cover sheet is preferably provided over a pressure sensitive layer on one surface of the tape. The tape can be separated longitudinally into two tape strips by the provision of a central longitudinally extending line of perforations.

7 Claims, 10 Drawing Figures

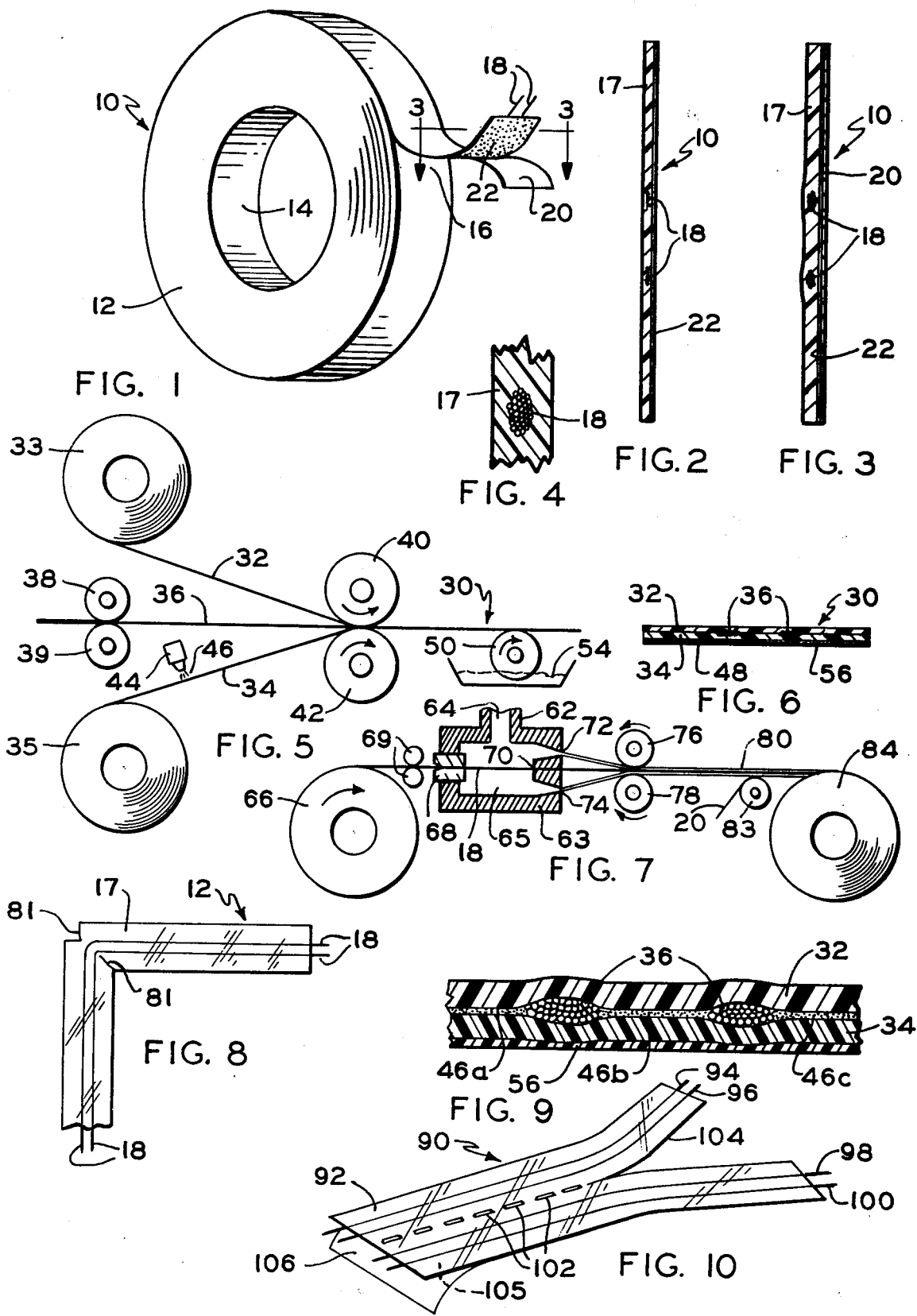

FLEXIBLE ELECTRICALLY CONDUCTIVE ADHESIVE TAPE

BACKGROUND OF THE INVENTION

1. FIELD OF THE INVENTION

The invention relates to electrical conductors in tape form and more particularly into a thin, flexible paper-like tape coated with pressure sensitive adhesive and containing electric wires.

2. THE PRIOR ART

A variety of electrical conductors have been available in strip form but few have been suitable for do-it-yourself wiring. As a result, the wiring of stereo amplifiers, burglar alarms, and other electrical appliances has been difficult and time consuming. In conventional wiring it is necessary to nail the conductors in place on the wall. This not only damages the wall but presents a poor appearance since it is impossible to make the strip correspond to the precise color of the wall or other surface to which the strip is applied. Some prior conductive strips have been bulky and difficult to store.

U.S. Pat. No. 3,253,085 describes an electrical conductor formed from a thick strip of rubber, having a height of about one-fourth of its width. A channel is molded into the lower surface of the rubber body. This product, because of its thickness, can hardly be considered a tape and its bulk renders it difficult to bend or form into a roll. Moreover, because of its size, the strip can be easily seen, is relatively expensive, and the ease of installation leaves much to be desired since rollers are needed to press it in place.

U.S. Pat. No. 3,524,921 describes a pair of metal foil conductors attached to a pressure sensitive tape strip. There is nothing covering the lower surface of the metal foil conductors, the tape being entirely on top of the conductors. As a result, the conductors themselves are not well protected and could even short out if an electrical conductor such as a nail or other object were present on the surface to which the strip is applied. The product would not be suitable for application to metal objects for the same reason.

U.S. Pat. No. 3,029,303 describes another relatively thick product formed from plastic or rubber in which two electrical wires are embedded. The thickness is about one-fifth of the height, consequently the product does not behave as a thin paper-like strip of tape and its relative stiffness would make it difficult to bend around corners. Because of its bulk it would occupy a great deal of space if an attempt were made to store it in a roll.

Strip conductors have been used for a variety of other purposes such as the provision of small electric lamps in window lighting, but the construction is substantially different, the purpose is not the same and the function is different in that a multiplicity of parallel lamp circuits are provided. See U.S. Pat. No. 3,894,225.

Another problem is the requirement for keeping the tape flexible and at the same time reducing the caliper of the tape as well as preventing marked enlargements in the thickness of the tape where the electrical conductors are located. Electrical conductors made up of a multiplicity of individual wires have good flexibility but the thickness of a bundle of wires can interfere with the winding of the tape into a uniform and stable roll or coil or can produce other problems.

OBJECTS

In view of these and other deficiencies of the prior art, the invention has the following objects and advantages:

a. The provision of a strong, durable, and flexible electrically conductive tape of paper thinness suitable for do-it-yourself wiring of homes, particularly for low voltage applications such as the wiring of audio and visual equipment, door bells, burglar alarms etc.

b. The provision of a thin flexible wiring tape that requires no separate fasteners such as nails and the like to bond it in place.

c. The provision of an electrically conductive tape for wiring applications which is relatively invisible when in use and will not provide a color contrast with the underlying wall or other surface to which it has been applied.

d. The provision of a tape of the type described which is low in cost, easy to use and to manufacture.

e. The provision of a tape of the type described which will divide into two separate conductive strips in a side-by-side relationship.

f. The provision of a tape of the type described which is of paper thinness and can easily be coiled and stored in a roll or coil like adhesive tape without becoming deformed so that it can be carried easily in workboxes and is suitable for over the counter sale to the do-it-yourself consumer.

g. The provision of an electrically conductive tape of the type described that is relatively simple to manufacture on existing equipment and includes either upper and lower superimposed tape strips having conductors sandwiched between them, or a single backing strip within which the electrically conductive wires are embedded.

SUMMARY OF THE INVENTION

A thin flexible electrically conductive adhesive tape is described. It is suitable for do-it-yourself wiring in low voltage applications and includes a pair of longitudinally extending parallel electrical conductors each made of a multiplicity of strands of twisted wire and enclosed within the backing. The backing is paper thin and can comprise a pair of layers of transparent or translucent material bonded together around the conductors or a single thickness of tape within which the conductors are embedded, for example by co-extrusion of upper and lower layers of thermoplastic material which are brought together while still in a molten condition so as to fuse together, totally embedding or enrobing the wires. A stripable cover sheet is preferably provided over a pressure sensitive layer on one surface of the tape. The tape can be separated longitudinally into two tapes by the provision of a central, longitudinally extending line of perforations.

In one form of the invention the electrical conductors comprise a pair of laterally spaced apart conductors each formed from a multiplicity of wires sandwiched between upper and lower layers of thin flexible paper-like strip material formed from transparent or translucent plastic resinous material bonded together on either side of the conductors and between the conductors and having a layer of pressure sensitive adhesive on one exposed surface. The conductors are flattened to spread out the multiplicity of wires in the plane of the tape either by passing them between a pair of cooperating aligned compression rolls positioned to engage the conductors just before the strips are brought together around them or by holding already flattened i.e. pre-flattened multi-strand conductors in the plane of the tape backing strips as the strips are united around them.

In another embodiment of the invention the tape comprises a single thin backing layer formed from a thermoplastic resinous material in which the conductors are embedded by fusing the thermoplastic resinous material to itself around them to form one integral homogeneous thickness of thermoplastic strip material that is flexible and thin like a strip of paper and has a layer of pressure sensitive adhesive applied to one of its exposed surfaces. The invention also contemplates the provision of a thin flexible paper-like tape including two pairs of laterally spaced apart conductors exposed therein and a longitudinal separation line extending length-wise between the pairs of conductors for dividing the tape into two separate laterally related strips each containing a single pair of conductors.

THE DRAWINGS

FIG. 1 is a perspective view of a tape embodying the present invention as it appears when wound into a roll for storage and sale prior to use.

FIG. 2 is a transverse cross-sectional view of the tape taken on line 2—2 of FIG. 1 on a much larger scale.

FIG. 3 is a view similar to FIG. 2 showing another embodiment of the invention.

FIG. 4 is an enlarged cross-sectional view of a portion of FIG. 3 adjacent to one of the conductors 18.

FIG. 5 is a diagrammatic side elevational view illustrating a method employed for forming the tape in accordance with one embodiment of the invention.

FIG. 6 is a transverse cross-sectional view on an enlarged scale of a tape formed in accordance with the method of FIG. 5.

FIG. 7 is a schematic diagram on a reduced scale illustrating a method used in forming a tape in accordance with another embodiment of the invention.

FIG. 8 is a top view of the tape after it has been applied to the surface of an object.

FIG. 9 is a vertical cross-sectional view of the center portion of FIG. 6 on a greatly enlarged scale.

FIG. 10 is a perspective view of another embodiment of the invention.

DESCRIPTION OF THE PREFERRED EMBODIMENTS

Refer now to the figures, and particularly the FIGS. 1, 2, and 3. Shown in FIG. 1 is a roll 10 of tape 12 wound as a continuous coil on a core 14 for storage prior to use. The tape 12 is partially unwrapped at 16. It includes a backing 17 and a pair of longitudinally extending laterally spaced apart parallel conductors 18 each formed from a multiplicity of fine electric wires such as copper wires closed within the backing 17. The tape 12 has a layer of pressure sensitive adhesive 22 applied to one of its exposed surfaces and over this adhesive layer is a separable cover sheet 20 e.g., a thin strip of paper to which is applied an easy release coating of known composition, examples of which are wax, Teflon, or other thin plastic film.

The backing 17 is a paper-thin layer, say for example, 2-10 mils thick, formed from paper or from a thermoplastic resinous material such as polyethylene, polypropylene, polyvinylchloride or the like, having electrical insulating properties, i.e. is a nonconductor of electricity. As shown in FIGS. 3 and 4 the electrical wires which make up the conductors 18 in this case are enclosed within an integral homogeneous thickness of the backing material. They can be thought of as being embedded within the backing. To enhance flexibility, particularly normal to the plane of the tape, the conductors 18 are flattened within the plane of the tape. The flattening can be of any degree but is preferably provided to at least make the conductors oval or oblate as seen in the cross-section. Flattening can be carried out to a greater degree, but if excessive, some damage may be done to the conductors causing a loss of strength. The separable cover sheet 20 is preferably bonded directly to the lower surface of the tape and is held in place by the pressure sensitive adhesive 22 which is permanently applied to the lower surface of the backing 17. As already mentioned, the cover sheet 20 has a release coating applied to its surface. Consequently when the cover sheet 20 is lifted it will peel away easily from the tape 12 leaving the pressure sensitive adhesive layer 22 exposed so that the tape can be applied directly to a work surface such as the surface of a wall or the trim around a door and will be held there by the adhesive.

The backing 17 can be formed from a variety of resinous material but is preferably transparent or translucent so that the underlying color of the substrate to which it is applied is visible through the backing. In this way the tape blends in with its surroundings.

Refer now to FIG. 5 which illustrates a method of forming another tape in accordance with the invention. As seen in the figure, a tape is formed from upper and lower strips 32 and 34 supplied from storage reels 33 and 35 which travel diagonally from left to right toward the nip between a pair of superimposed mating pressure rolls 40 and 42 that are driven in the directions shown to carry the tape from left to right in the figure, and due to the pressure of the rolls toward one another, the upper and lower layers 32 and 34 are united around the conductor 18. The strips are bonded together by the application through nozzle 44 of an adhesive 46 which entirely fills the space between superimposed layers 32 and 34 as best seen in cross-section (FIG. 9). The resulting tape has three adhesive strips 46a at the left, 46b between the parallel conductors 36 and the strip 46c on the opposite side of the conductors. Just before passing to the nip between rolls 40 and 42, the conductors 36 pass between a pair of compression rolls 38 and 39 which are driven in the same direction and are forced toward one another to compress the conductors 36 to give them each a flattened cross-section lying in the plane extending between them, the plane also corresponds to the plane of the finished tape 30 after assembly. The compression between the rolls 38 and 39 is enough to flatten the conductors as shown in FIGS. 6 and 9. This helps prevent the surfaces of the tape from having large bulges and at the same time promotes flexibility normal to the plane of the tape. The roll pressure applied should not be so great as to damage the conductors during fabrication to the point where they are weakened excessively.

A pressure sensitive adhesive 56 is applied to the lower surface of the tape 30 by means of an application roll 50 which is partially immersed within a bath 54 of the adhesive in liquid form. Any suitable known pressure sensitive adhesive can be applied. One preferred pressure sensitive adhesive comprises a mixture of rubber with a sticky resinous material and a small amount of an oily material for promoting adhesion. This mixture is dissolved in an organic solvent that functions as a carrier for promoting application to the surface of the composite tape and evaporates immediately thereafter. The resulting tape which may have a thickness of about 6 mils is a strong, highly flexible, thin, electrically conductive adhesive tape with a backing which is paper-like in its consistency. A variety of materials can be used to form the backing 32, 34. Typical materials comprise cellulosics such as cellulose acetate, or what is commonly refered to as cellophane, strips of polyvinylchloride, polyethylene or polypropylene, nylon, mylar and the like.

Refer now to FIG. 7 which illustrates a method of forming another tape in accordance with the invention. As seen in the figure, molten plastic is supplied through a pipe 62 that can be connected up-stream to a plastic extruder (not shown) of any suitable known construction. Pipe 62 is connected to an extrusion head 63 through an inlet port 64 at the top thereof. The plastic resin flows during operation downwardly through the port 64 into a hollow inner space 65 within the extrusion head. At the left, two conductors are supplied from a reel 66. They travel from left to right through a pair of superimposed aligned and parallel pressure rollers 69 which compress them in the plane contained mutually between them which also corresponds to the plane of the finished tape. The flattened conductors 18 then enter an inlet gate 68 through small holes into the molten resin within the hollow interior 65 of the head 63. The conductors then pass out through holes in an outlet gate 70 toward the right as seen in the figures. Simultaneously resin is extruded through a pair of superimposed horizontally disposed narrow slots 72–74 positioned above and below the outlet gate 70. While the resin passing out through the slots is still hot, sticky and in a molten condition, it is compressed together and united around the conductors 18 by pressure from a pair of aligned cooperating assembly rolls 76, 78. This forces the resin to completely enrobe the flattened conductors 18 which are thus embedded within the backing 7.

After passing between the rolls 76, 78 a pressure sensitive adhesive layer (not shown) and the separable cover sheet 20 are applied. The cover sheet 20 is joined to the tape by passing over roll 83 just before the tape is wound into a roll 84 as shown at the right in FIG. 7.

Refer now to FIG. 8. In FIG. 8 it can be seen that the tape 12 is thin, flexible, and transparent or translucent allowing the underlying surface to be seen through it. Small pieces can be cut out as shown in 81 to allow the tape to make right angle bends to the left or right. The conductors 18 extend from the ends of the tape when the tape is cut away allowing electrical connections to be made.

Refer now to FIG. 10. In FIG. 10, a tape strip 90 is shown in perspective view including a paper thin backing 92 of transparent or translucent plastic resinous material having two side-by-side pairs of conductors including a first pair 94–96 at the left and a second pair 98–100 at the right, all aligned in parallel laterally spaced apart relationship and extending longitudinally of the tape. Directed lengthwise of the tape and extending through the center thereof between the conductors is a row of perforations consisting of longitudinally spaced apart cuts that enable the tape to be divided longitudinally as shown at 104 into two separate strips for a variety of wiring purposes. The tapes and the conductors themselves 94–100 can be color coded so that a person using the tape will know where each conductor is to be connected. The tape is preferably provided with a separate cover sheet 106 applied to the lower pressure sensitive surface 105 of the tape to allow the tape to be easily uncoiled from its storage roll. If no cover sheet 106 is used, the upper surface of the tape is preferably coated with an easy release film such as a composition containing silicone oil or Teflon.

The invention is well suited for use in do-it-yourself applications and can be stored easily in a small space as a roll because of the paper thinness of the backing. Its flexibility allows it to make bends easily and to be used in a variety of applications. The electrically conductive tape can be attached to windows, door frames, mop boards, walls and in any other location where one would want to hide the installation. The width and thickness of the tape is commensurate with the thickness of the wire used. While transparent tape is prefered it can be made in colors to match certain surfaces.

If desired, the conductors can be separately insulated before being enclosed in the tape backing. Normally, however, the tape backing itself insulates the wire.

Having described the invention in detail, a great many modifications and variations thereof will be apparent to those skilled in the art within the scope of the appended claims once the principles of the invention are understood.

What is claimed is:

1. A thin, flexible, electrically conductive ribbon-like adhesive tape suitable for do-it-yourself wiring comprising
    (a) a thin paper-like tape backing wound into a roll,
    (b) a pair of spaced apart electrical conductors,
    (c) each of said conductors comprising a multiplicity of electrical wires,
    (d) each of the conductors being a formerly cylindrical bundle of wires and said cylindrical bundle of wires being compressed in the plane of said tape and thereby being at least partially flattened to spread out the multiplicity of wires in the plane of the tape backing such that the tape can be wound and stored in a coil,
    (e) said flattened bundle of wires having a thickness greater than a single wire and the bundle being generally oval or oblate as seen in cross section,
    (f) said compression of the bundle of wires being insufficient to produce a significant loss of strength therein,
    (g) said backing comprising a member selected from the group consisting of paper and flexible plastic resinous sheet materials having electrical insulating properties constructed and arranged to insulate the wires,
    (h) said wires being enclosed within the tape and a layer of pressure sensitive adhesive material on at least the lower surface of the tape to bond the tape to an underlying supporting surface while in use.

2. The flexible tape of claim 1 wherein the electrical conductors are enclosed within the backing by being sandwiched between a pair of superimposed layers of said tape, said layers being bonded together by three bonding strips one of which is located between the electrical conductors of the other two of which are located on opposite sides of the conductors.

3. The tape of claim 1 wherein a stripable cover sheet is releaseably bonded to the pressure sensitive adhesive layer.

4. The adhesive tape of claim 1 wherein electrical conductors are embedded within the tape by being enclosed within a single thickness of the tape, said tape being formed by co-extrusion of upper and lower layers composed of a thermoplastic resinous material and the adjacent surfaces of the layers being fused together around the conductors to form an integral homogeneous mass of said thermoplastic resinous material surrounding and embedding the electrical conductors.

5. The tape of claim 1 wherein the tape has a longitudinal line of weakness extending from one end thereof to the other for separating the tape into two laterally related tape strips and each of the strips includes at least one electrical conductor.

6. The tape of claim 5 wherein the weakness comprises perforations and a pair of conductors is on either side thereof.

7. The tape of claim 1 wherein the backing comprises a paper thin strip formed from transparent or translucent plastic resinous material.

* * * * *